(12) United States Patent
Zybura et al.

(10) Patent No.: US 9,294,067 B2
(45) Date of Patent: Mar. 22, 2016

(54) COMBINED BALUN TRANSFORMER AND HARMONIC FILTER

(71) Applicant: RF Micro Devices, Inc., Greensboro, NC (US)

(72) Inventors: Michael F. Zybura, Scotts Valley, CA (US); Marcus Granger-Jones, Scotts Valley, CA (US)

(73) Assignee: RF Micro Devices, Inc., Greensboro, NC (US)

(*) Notice: Subject to any disclaimer, the term of this patent is extended or adjusted under 35 U.S.C. 154(b) by 560 days.

(21) Appl. No.: 13/668,743

(22) Filed: Nov. 5, 2012

(65) Prior Publication Data

US 2013/0113300 A1 May 9, 2013

Related U.S. Application Data

(60) Provisional application No. 61/555,311, filed on Nov. 3, 2011.

(51) Int. Cl.
| | |
|---|---|
| H02M 1/12 | (2006.01) |
| H01F 21/00 | (2006.01) |
| H03H 7/42 | (2006.01) |
| H03H 7/01 | (2006.01) |
| H03H 7/09 | (2006.01) |

(52) U.S. Cl.
CPC ............... *H03H 7/42* (2013.01); *H03H 7/0115* (2013.01); *H03H 7/09* (2013.01); *H03H 7/1775* (2013.01)

(58) Field of Classification Search
CPC ................................. H02M 3/335; G05F 3/06
USPC ............ 363/16; 343/860, 850, 858, 859, 861, 343/852; 323/355; 455/292; 307/105
See application file for complete search history.

(56) References Cited

U.S. PATENT DOCUMENTS 5,986,617 A * 11/1999 McLellan ..................... 343/860
2011/0019439 A1 * 1/2011 Lee et al. ........................ 363/16

* cited by examiner

*Primary Examiner* — Rexford Barnie
*Assistant Examiner* — Dru Parries
(74) *Attorney, Agent, or Firm* — Withrow & Terranova, P.L.L.C.

(57) ABSTRACT

In one embodiment, a balanced to unbalanced transformer utilizes a crossover configuration such that some portion of the secondary coil (inductor) is shared between two resonators (capacitors). Adding a first capacitor in parallel with a portion of the secondary inductor creates a first harmonic trap (filter), and also efficiently uses the secondary coil (inductor) as a resonating element.

Adding a second capacitor which shares (crossover configuration) a portion of the secondary inductor with the first capacitor creates a second harmonic trap (filter), which may be tuned to the same harmonic as the first harmonic trap, or may be tuned to a different harmonic.

11 Claims, 9 Drawing Sheets

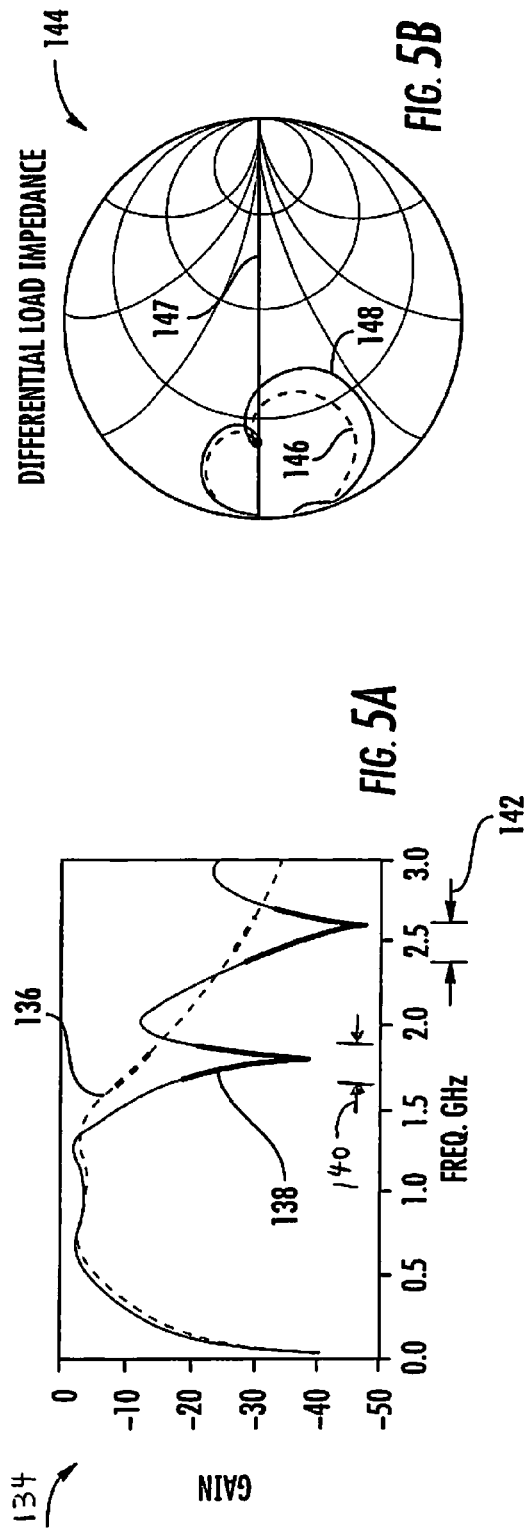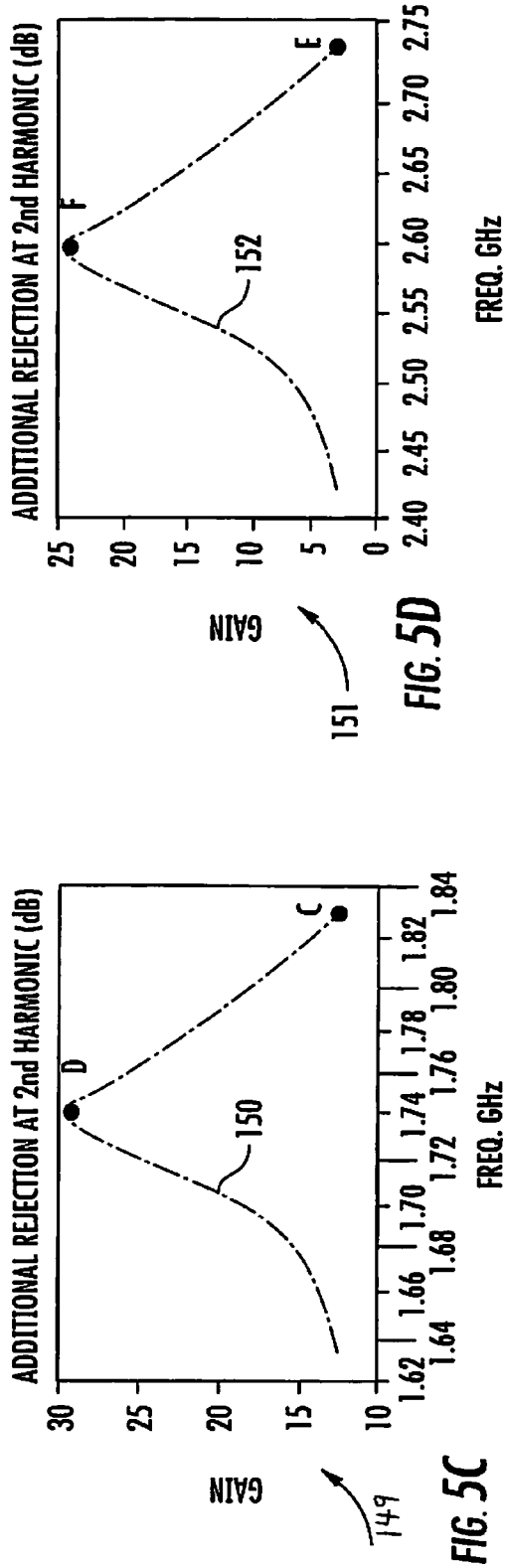

COMBINED BALUN TRANSFORMER AND HARMONIC FILTER

RELATED APPLICATIONS

This application claims the benefit of provisional patent application Ser. No. 61/555,311, filed Nov. 3, 2011, the disclosure of which is hereby incorporated herein by reference in its entirety.

FIELD OF THE DISCLOSURE

The field of the disclosure is transformers; specifically, transformers that utilize a crossover configuration such that at least some portion of the secondary coil (inductor) is shared between two resonators (capacitors).

BACKGROUND

Conventional transformers are employed widely for matching from the optimal impedance at a differential Power Amplifier (PA) output to a desired system impedance level. A typical block diagram of such an amplifier is illustrated in FIG. 1.

FIG. 1 illustrates a conventional power amplifier 10 employing a balanced to unbalanced transformer (a "balun" transformer) to perform a desired impedance match.

In the primary side of FIG. 1, amplifier 12 is a differential power amplifier, powering port (or positive node) 14 and port (or negative node) 16. These are balanced ports, or balanced nodes. Primary capacitor 18 links port 14 to port 16. Primary inductor (or coil or winding) 20 also links port 14 to port 16. Thus, primary capacitor 18 and primary inductor 20 are in parallel. Dot 30 marks the top side of primary inductor 20. Throughout this specification and claims, the adjective "top" refers to a dotted end of an inductor. Using a differential power amplifier 12 yields a balanced power output, such that a virtual ground exists in the center of primary inductor 20.

In the secondary side of FIG. 1, secondary inductor 22 is magnetically coupled with primary inductor 20, such that the dotted ends (top ends) of these inductors are in phase. The top of secondary inductor 22 is directly linked to port 24, which is an unbalanced port. A bottom of secondary inductor 22 is directly linked to ground 28, which causes the unbalanced port. Secondary capacitor 26 is linked in parallel to secondary inductor 22.

Both primary and secondary coils (primary inductor 20 and secondary inductor 22) are resonated with capacitors (primary capacitor 18 and secondary capacitor 26 respectively) to present real impedances at the frequency of interest. In a cellular PA (power amplifier) tuned for high efficiency, the harmonic levels at the unbalanced output port 24 must later be filtered (not shown) to meet the ETSI (European Telecommunications Standards Institute) standards at the antenna. These standards and the associated filter losses result in a direct trade-off between the overall efficiency of the amplifier and the harmonic levels.

SUMMARY

In one embodiment, a secondary side of a circuit includes a main central secondary inductor, a first filtering capacitor linked in parallel with the main central secondary inductor, a first unbalanced side secondary inductor linking the top of the central secondary inductor to an unbalanced port, a ground side secondary inductor linking the bottom of the central secondary inductor to a first ground; and a secondary capacitor linking the top of the central secondary inductor to a second ground.

In some embodiments, the main central secondary inductor is segmented into a first central secondary inductor and a second central secondary inductor, and a second filtering capacitor links a node between the two segments to the first ground, thus creating a crossover topology.

In some embodiments, additional inductors are inserted in the unbalanced side of the main central secondary inductor, and/or in the ground side of the main central secondary inductor.

In some embodiments, a balanced to unbalanced transformer utilizes a crossover configuration such that some portion of the secondary coil (inductor) is shared between two resonators (capacitors). Adding a capacitor in parallel with a portion of the secondary inductor creates a harmonic trap (filter), and also efficiently uses the secondary coil (inductor) as a resonating element for a particular harmonic.

In some embodiments, a transformer structure uses a harmonic trap, or traps, for differential mode excitations along with the traditional impedance transformation function. The addition of a first filtering capacitor facilitates a more efficient use of, what is already by design, a high Q secondary coil as a resonating element for a particular harmonic, or with multiple capacitors for several harmonics. This structure facilitates higher efficiency power amplifier performance while maintaining ETSI harmonic levels with minimal impact on cost and area.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 5A-5D illustrate improved results due to two added capacitors to address the second and third harmonics.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
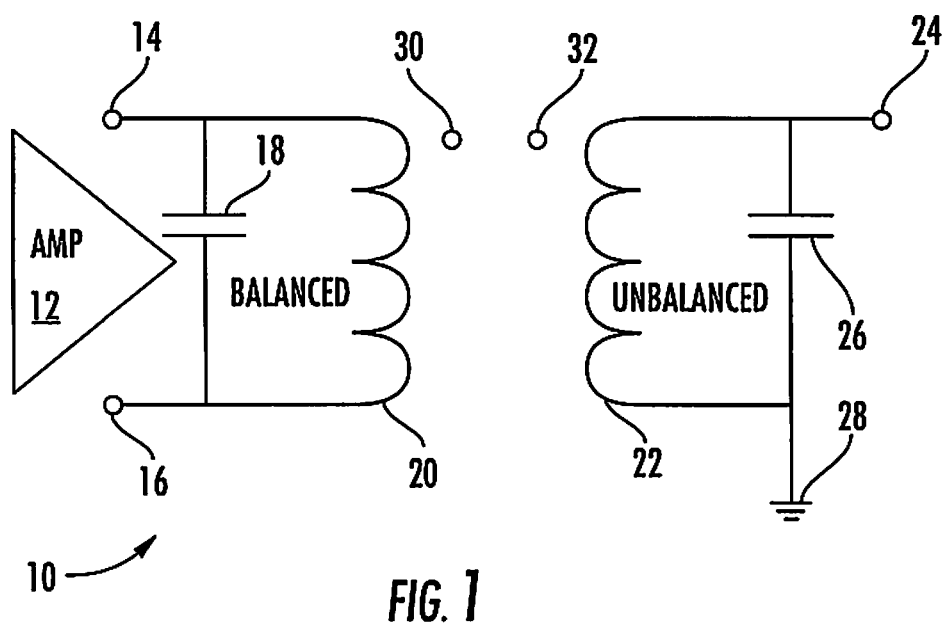
FIG. 1 illustrates a conventional power amplifier employing a balanced to unbalanced transformer (a "balun" transformer) to perform a desired impedance match.

As discussed in the summary, FIG. 1 illustrates a conventional power amplifier 10 employing a balanced to unbalanced transformer (a "balun" transformer) to perform a desired impedance match.

Figure 2:
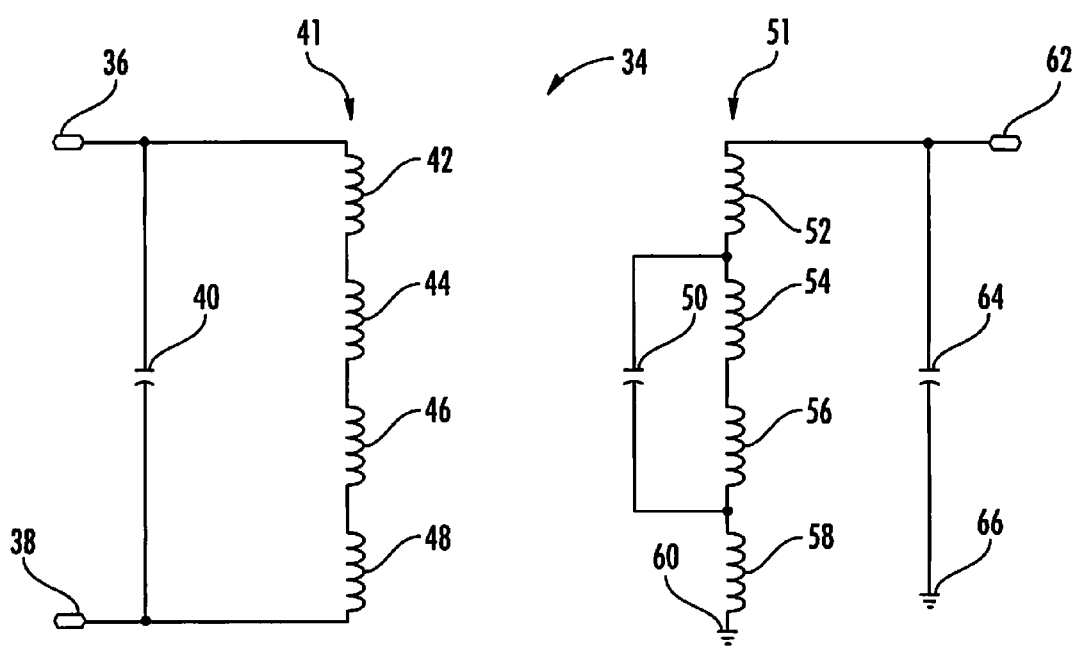
FIG. 2 illustrates a balun transformer with the primary inductor segmented into four sections, and with an added capacitor (first order topology).

FIG. 2 illustrates a balun transformer with the primary inductor segmented into four sections, and with an added capacitor (first order topology).

In the primary side (left side) of FIG. 2, balanced ports 36 and 38 are linked by primary capacitor 40, and are also linked by a primary inductor 41 segmented into four sections: 42, 44, 46, and 48. Segmenting inductors into four sections facilitates certain convenient options, such as using the connection between 44 and 46 as a center tap or virtual ground.

In FIG. 2, a secondary inductor 51 is segmented into four sections 52, 54, 56, and 58 (four small inductors in series). Each of these secondary inductor sections is magnetically linked to a respective primary inductor section. The top of primary inductor 42 has the same phase as the top of 52 (the transformer dots are not shown), and similarly for the other sections.

Similar to FIG. 1, the top of secondary inductor 51 is linked directly to unbalanced port 62. The bottom of secondary inductor 51 is grounded to a first ground 60. A secondary capacitor C2ND 64 links the top of inductor 51 to a second ground 66.

Also on the secondary side, an additional secondary capacitor 50 (a first filtering capacitor preferably targeting the second harmonic) is linked across secondary inductors 54 and 56, such that a parallel resonance is established at roughly the inverse root of the product of the parallel capacitive and inductive components. The series of inductors 54 and 56 is parallel with secondary capacitor 50.

FIGS. 3A-3D illustrate improved results due to the added secondary capacitor 50, which acts as a first filtering capacitor. Simulations of the transformer equivalent circuit for a GSM (Global System for Mobile Communication) low band application with and without an additional capacitor (50 of FIG. 2) are shown in FIG. 3. The simulations employed a basic approximation of a transformer utilizing a coupling factor, K, of 0.7, and primary and secondary coil quality factors (Q) are both 25. Equivalent SMD (surface mount device) models are employed for all capacitors. These values are conservative for a laminate-based transformer design.

Figure 3B:
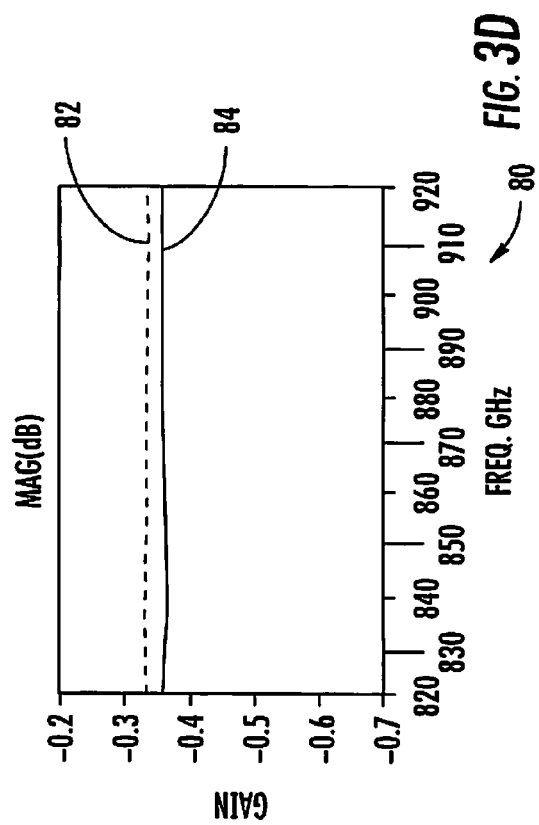
FIGS. 3A-3D illustrate improved results due to the added capacitor.
Figure 3D:
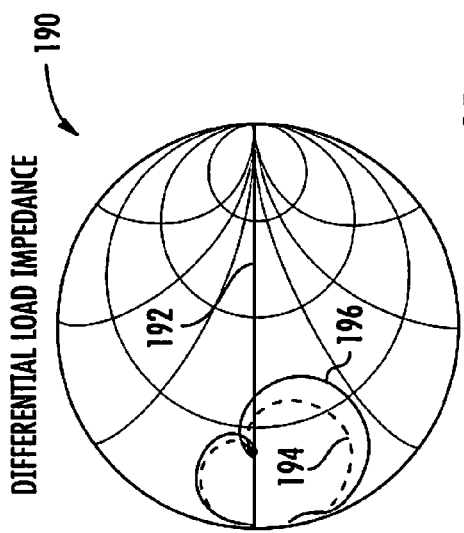
Figure 3A:
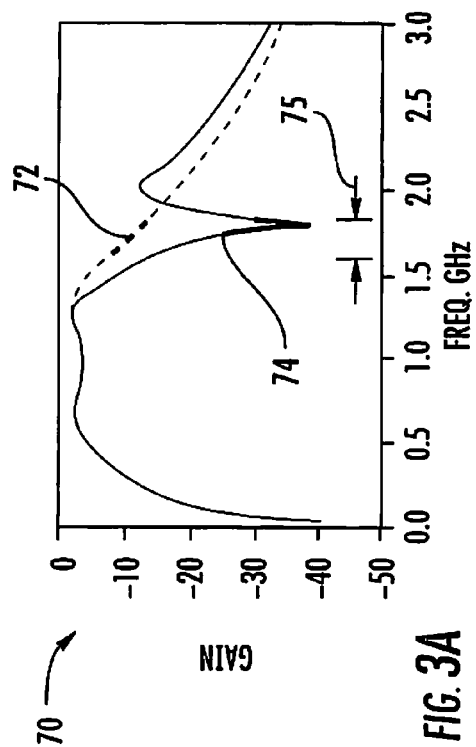

FIG. 3A is a graph 70 illustrating gain (dB) versus frequency (GHz) for initial results 72 (without capacitor 50) as a dashed line, and improved results 74 (with capacitor 50) as a solid line. The thick portions of these two lines indicate the region of special interest 75 (from about 1.62 to 1.84 GHz), which is where filtering of the first harmonic is desired.

FIG. 3B is a Smith Chart 190, with a real impedance axis 192 ranging from 0 at the left end to infinity at the right end. The differential load impedance 194 for a frequency from 10 MHz to 3 GHz is graphed as a dotted line. The differential load impedance 196 for a frequency of 820 MHz to 920 MHz is graphed as a solid line. An impedance of 10 ohms is achieved at the band of interest (824-915 MHz).

Figure 3C:
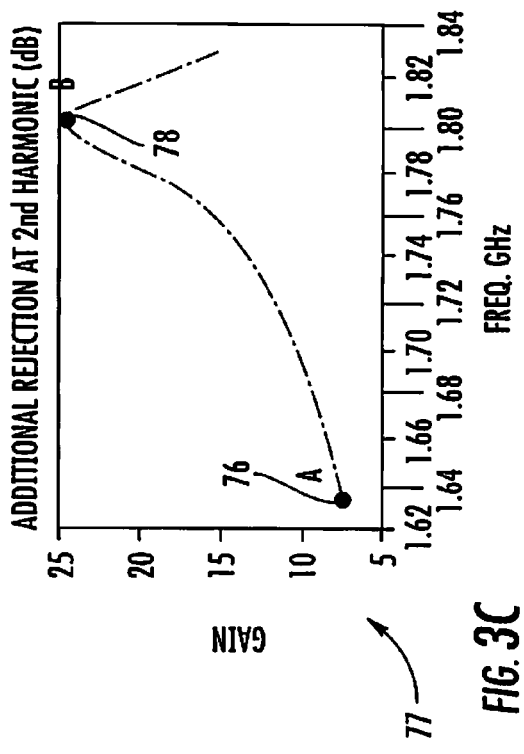

FIG. 3C is a graph 77 illustrating a differential gain (dB) of the initial results 72 minus the improved results 74 (of FIG. 3A) over the region of special interest 75 of FIG. 3A, which is from about 1.62 to 1.84 GHz. In this region, the maximum additional rejection of the second harmonic (due to the additional capacitor) is 25 dB at 1.8 GHz as shown at point B 78. In this region, the additional rejection is at least 7 dB, as shown at point A 76.

FIG. 3D is a graph 80 illustrating the initial results 82 and the improved results 84 for MAG (maximum available gain) as a function of frequency. The "improved results" of the additional capacitor only slightly decrease the MAG by about 0.2 dB, which is a very minor cost in order to achieve the substantial additional rejections illustrated in FIG. 3C for the second harmonic.

To summarize FIGS. 3A-D, the initial rejection at the second harmonic is roughly 12 dB (a gain of −12 dB at 1.8 GHz in FIG. 3A on line 72). Upon adding an additional capacitor (50), an additional second harmonic rejection ranging from 7 to 25 dB is achieved across the band of interest 75. The impact on MAG (maximum amplitude gained) is very small (only approximately 0.02 dB (se FIG. 3D) reduction in gain) because a large secondary inductor quality factor (Q=25 used here) is reasonable with an optimal transformer design.

Referring briefly back to FIG. 2, the dual use of inductor segments 54 and 56 of the secondary inductor 51 facilitates both low loss and small footprint, avoiding the requirement of an additional filter (including an additional inductor) to process the unbalanced output of port 62. An additional benefit lies in the loose dependence of the fundamental impedance and the value of additional capacitor 50 (first filtering capacitor). This loose dependence allows potential in-situ "trimming" (adjustment or tuning changes by changing the capacitance of the added capacitor) for harmonic rejection without degrading power and efficiency.

Figure 4A:
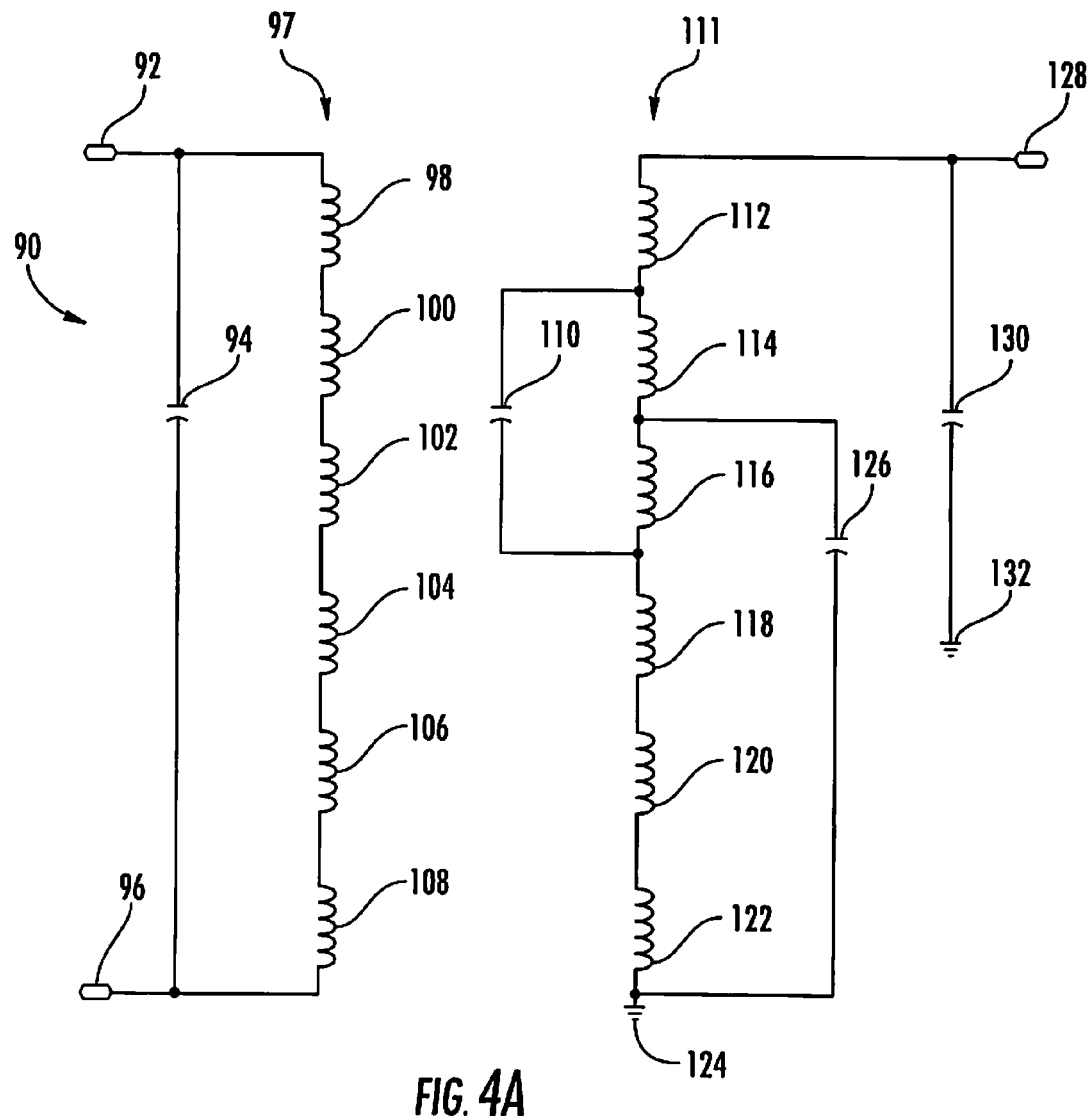
FIGS. 4A-4C illustrate multiple configurations with two added capacitors (second order topology).
Figure 4B:
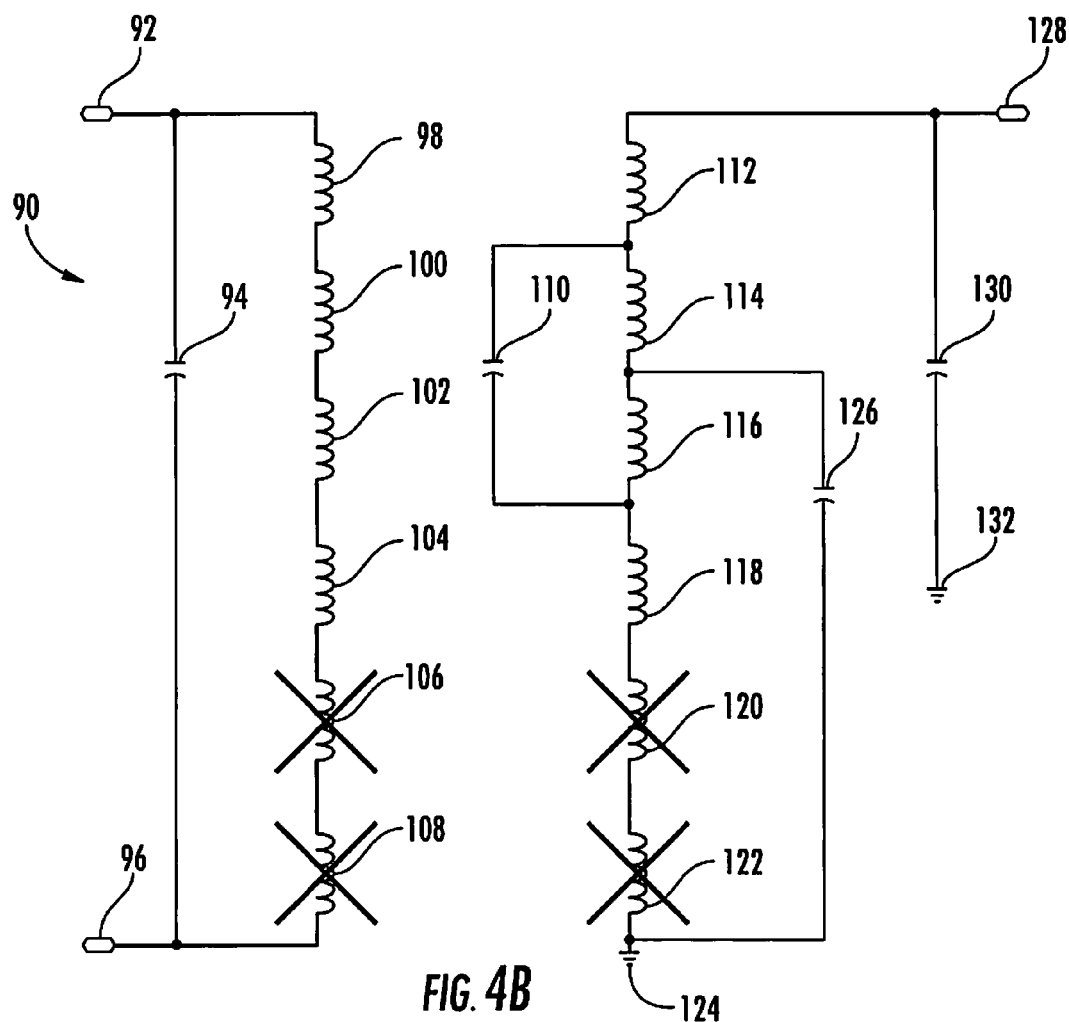
Figure 4C:
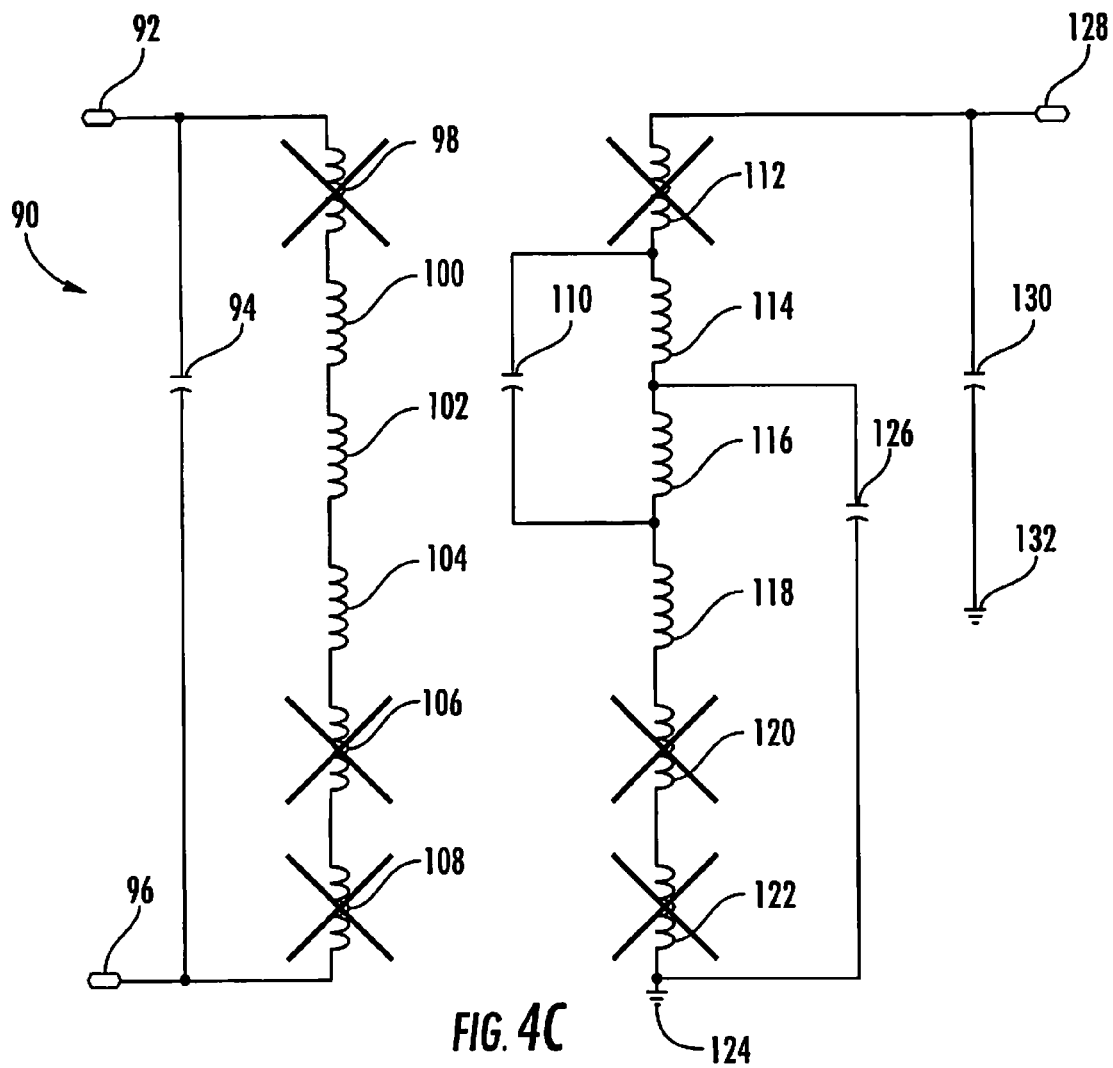

FIGS. 4A-C illustrate multiple configurations with two added capacitors, creating a second order topology with a "crossover" configuration.

In FIG. 4A, two additional capacitors (110 and 126) are added to the basic configuration of FIG. 1, and each inductor is segmented into six segments.

In the primary side, ports 92 and 96 are linked by primary capacitor 94, and are linked by primary inductor 97. Primary inductor 97 is segmented into six segments: 98, 100, 102, 104, 106, and 108.

In the secondary side, secondary inductor 111 is segmented into six inductor segments: first unbalanced side secondary inductor 112, first central secondary inductor 114, second central secondary inductor 116, first ground side secondary inductor 118, second ground side secondary inductor 120, and third ground side secondary inductor 122. The top of secondary inductor 111 has the same phase as the top of primary inductor 97 (dots are not shown), and is linked directly to unbalanced port 128. Secondary capacitor 130 links the top of secondary inductor 111 to ground 132.

Two additional capacitors (first filtering capacitor 110 and second filtering capacitor 126) may be designed to address both the second and third harmonics of the 824-915 MHz band, respectively. Alternatively, both of these additional capacitors may be designed to address the second harmonic. These two additional capacitors (110 and 126) may be placed in a "crossover" configuration such that at least one inductor segment (such as inductor segment 116 in FIG. 4A) of secondary inductor 111 is shared by the two additional capacitors.

The first additional capacitor 110 (first filtering capacitor) is in parallel with a series including inductor segments 114 and 116. The second additional capacitor 126 (second filtering capacitor) is in parallel with a different series including inductor segments 116, 118, 120, and 122. Inductor segment 116 is "shared" by both additional capacitors, creating a "crossover" configuration.

FIG. 4B is identical to FIG. 4A, except that two inductor segments 106 and 108 on the primary side, and corresponding inductor segments 120 and 122 on the secondary are removed (as shown by the large "X"s through these inductors).

FIG. 4C is identical to FIG. 4B, except that a third inductor segment 98 on the primary side, and corresponding inductor segment 112 on the secondary side are additionally removed (as shown by the large "X"s through these inductors).

FIGS. 5A-5D illustrate improved results due to the two added capacitors (110 and 126) in FIG. 4A (a second order topology).

FIG. 5A graphs the results of the circuit of FIG. 4A (two additional capacitors, with inductors segmented into 6 sections). In FIG. 5A, graph 134 plots gain in dB versus frequency in GHz. Line 136 shows the initial results with no additional capacitors. Line 138 shows the improved results with two additional capacitors. Band 140 is approximately 1.6 GHz to 1.8 GHz (second harmonic), and band 142 is approximately 2.4 GHz to 2.75 GHz (third harmonic).

FIG. 5B is a Smith Chart 144, with a horizontal real impedance axis 147 ranging from zero ohms at the left end, to infinity ohms at the right end. The differential load impedance 146 for a frequency from 10 MHz to 3 GHz is graphed as a dashed line. The differential load impedance 148 for a frequency of 820 MHz to 920 MHz is graphed as a solid line.

FIG. 5C is a graph 149 illustrating the additional rejection (or reduction in gain) of the improved results 138 (relative to the initial results 136) over the band 140 for the second harmonic. The frequency axis of FIG. 5C is expanded relative to the frequency axis of FIG. 5A. In FIG. 5C, the additional rejection 150 varies from 12 dB (minimum) at point C to 30 dB (maximum) at point D for the second harmonic.

FIG. 5D is a graph 151 illustrating the additional rejection (or reduction in gain) of the improved results 138 (relative to the initial results 136 in FIG. 5a) over the band 142 for the third harmonic. The frequency axis of FIG. 5D is expanded relative to the frequency axis of FIG. 5A. In FIG. 5D, the additional rejection 152 varies from 3 dB (minimum) at point E to 24 dB (maximum) at point F for the third harmonic.

The "added in" band loss for the MAG remains very small, about 0.02 dB (not shown, but similar to FIG. 3D), and the bandwidth of the desired impedance is improved.

Figure 6A:
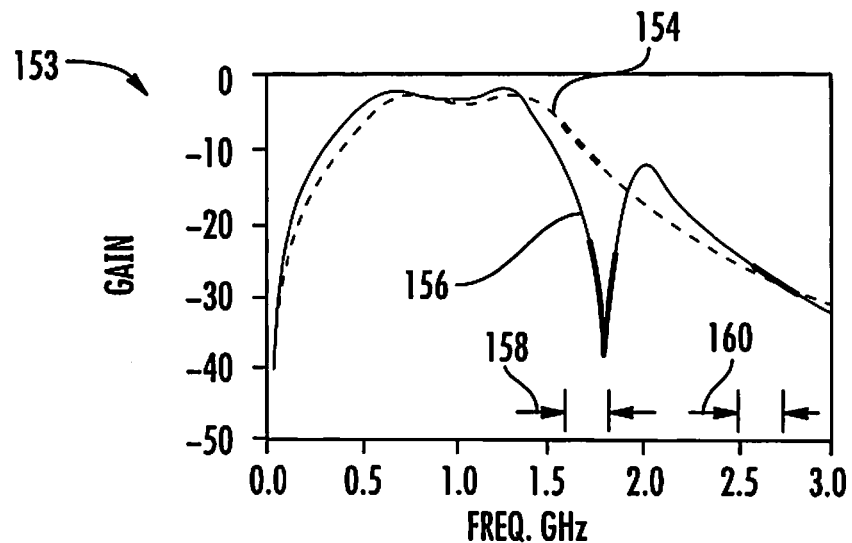
FIGS. 6A and 6B illustrates improved results due to two added capacitors, wherein both added capacitors address only the second harmonic.
Figure 6B:
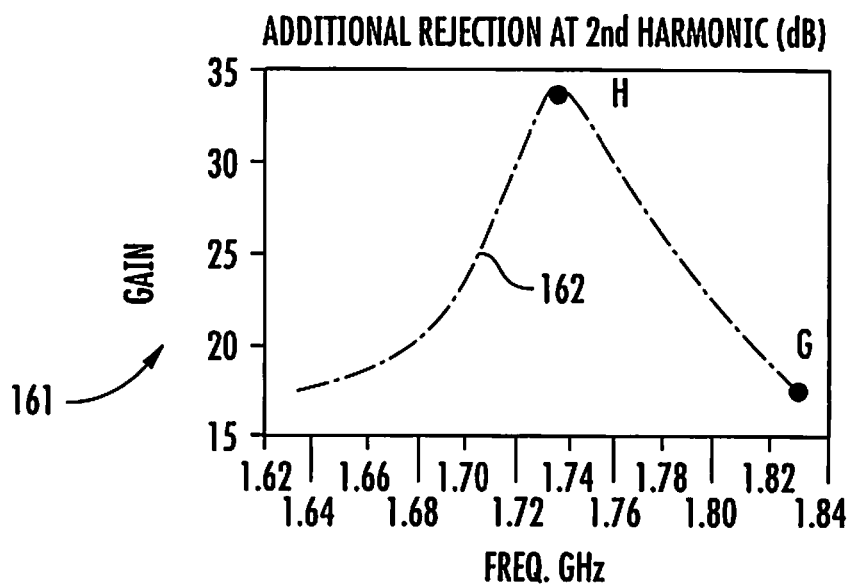

FIGS. 6A-6B illustrate improved results due to two added capacitors, wherein both added capacitors are designed to address only the second harmonic.

FIG. 6A is a graph 153 plotting gain (dB) versus frequency (GHz) for initial results 154, and for improved results 156 with the additional capacitors 110 and 126 both being sized to filter the second harmonic in band 140 from 1.6 GHz to 1.82 GHz. Band 160 for the third harmonic is shown only for the sake of completeness.

FIG. 6B is a graph 161 illustrating the additional rejection (or reduction in gain of improved results relative to initial results) in band 158 for the second harmonic. The additional rejection ranges from 16 dB (minimum) at point G, to 34 dB at point H.

Thus, when using two additional capacitors, the maximum additional rejection at the second harmonic is 30 dB (see point D in FIG. 5C) when one additional capacitor addresses the second harmonic and the other additional capacitor addresses the third harmonic. In contrast, the maximum additional rejection at the second harmonic is 34 dB (see point H in FIG. 6B) when both additional capacitors address the second harmonic.

FIGS. 7A-7D illustrate results for a single additional capacitor (first order topology), specifically for a simulation of a CX40FL transformer with an additional capacitor tapped at ¼ and ¾ of the length of the secondary coil.

Figure 7B:
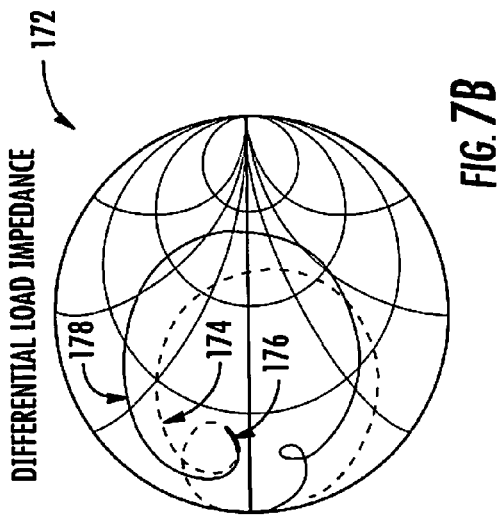
FIGS. 7A-7D illustrate physical results for a single additional capacitor (first order topology).
Figure 7D:
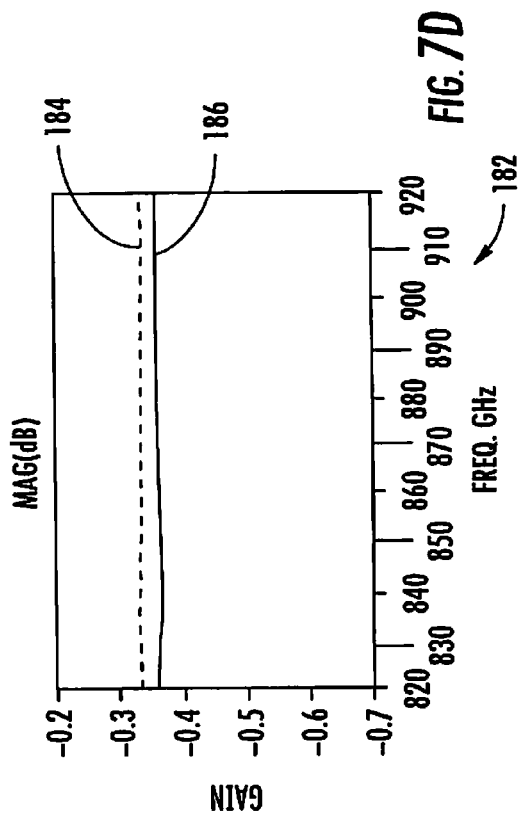
Figure 7A:
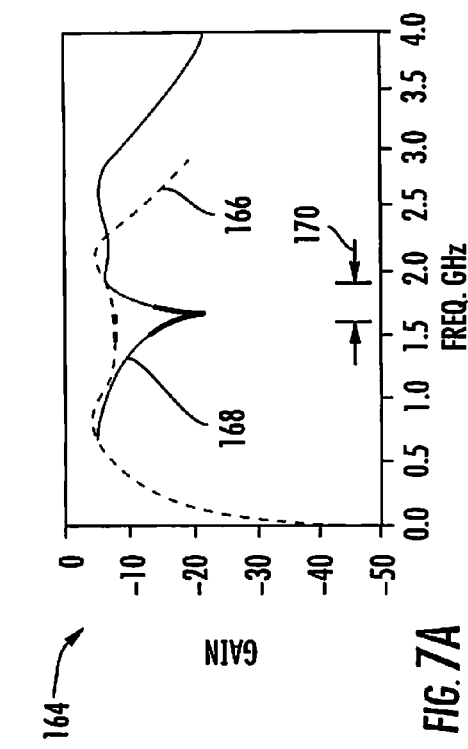
Figure 7C:
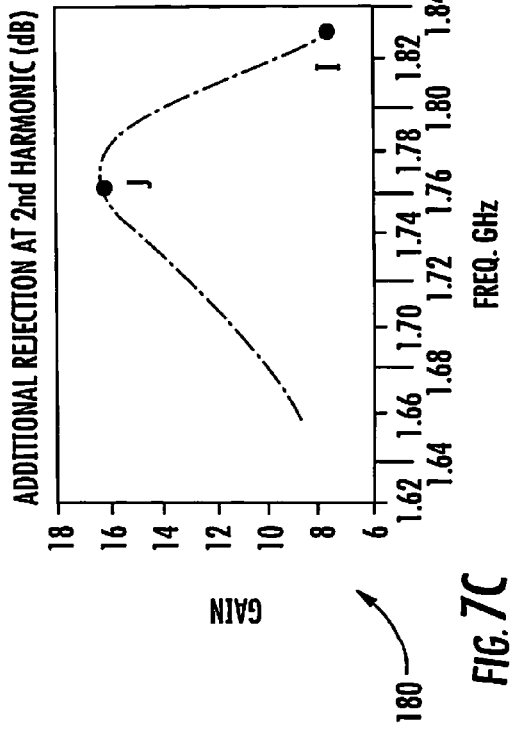

FIG. 7A is a graph 164 plotting gain dB versus frequency GHz for an initial result 166 (without the additional capacitor) and an improved result 168 (with the additional capacitor).

FIG. 7B is a Smith graph 172 of differential load impedance 174 (for a frequency of 10 MHz to 3 GHz 174), and differential load impedance 176 (for a frequency of 820 MHz to 920 MHz), and a differential load impedance 178 (for a differential load of 10 MHz to 4 GHz).

This disclosure may be implemented, but is not confined to, laminate technology. This disclosure (due to tighter feature registration), is more easily implemented in semiconductor-based mediums in which active tuning of the filters may be effected with diodes, FET's, or MEMS-based elements)

The embodiments shown herein may also be instantiated with the primary inductor by utilizing the differential nature of the signal there, or in a hybrid fashion where both inductors (primary and secondary) are employed. All such variations are considered to be within the scope of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A circuit for transforming and filtering, the circuit comprising:
    a main central secondary inductor having a top and a bottom;
    a first filtering capacitor coupled between the top and the bottom of the main central secondary inductor;
    a first unbalanced side secondary inductor having a top coupled to an unbalanced port and a bottom coupled to the top of the main central secondary inductor;
    a ground side secondary inductor having a top coupled to the bottom of the main central secondary inductor and a bottom coupled directly to ground; and
    a secondary capacitor linking the top of the first unbalanced side secondary inductor to ground.

2. The circuit of claim 1,
    wherein the main central secondary inductor is segmented into a first central secondary inductor and a second central secondary inductor,
    wherein the first central secondary inductor has a top corresponding to the top of the main central secondary inductor, and has a bottom; and
    wherein the second central secondary inductor has a top linked to the bottom of the first central secondary inductor, and has a bottom corresponding to the bottom of the main central secondary inductor.

3. The circuit of claim 2, further comprising:
    a first primary inductor having a top coupled to a first balanced port and a bottom and configured to magnetically communicate with the first unbalanced side secondary inductor, wherein the top of the first primary inductor is in phase with the top of the first unbalanced side secondary inductor;
    a second primary inductor having a top coupled to the bottom of the first primary inductor and a bottom and configured to magnetically communicate with the first central secondary inductor, wherein the top of the second primary inductor is in phase with the top of the first central secondary inductor;

a third primary inductor having a top coupled to the bottom of the second primary inductor and a bottom and configured to magnetically communicate with the second central secondary inductor, wherein the top of the third primary inductor is in phase with the top of the second central secondary inductor; and a fourth primary inductor having a top coupled to the bottom of the third primary inductor and a bottom coupled to a second balanced port and configured to magnetically communicate with the ground side secondary inductor, wherein the top of the fourth primary inductor is in phase with the top of the ground side secondary inductor.

4. The circuit of claim 3, further comprising:
a primary capacitor coupled between the top of the first primary inductor and the bottom of the fourth primary inductor.

5. The circuit of claim 2, further comprising:
a second filtering capacitor coupled between the top of the second central secondary inductor and ground.

6. A circuit for transforming and filtering, the circuit comprising:
a first central secondary inductor having a top coupled directly to an unbalanced port and a bottom;
a second central secondary inductor having a top coupled to the bottom of the first central secondary inductor and a bottom;
a first ground side secondary inductor having a top coupled to the bottom of the second central secondary inductor and a bottom coupled to ground;
a secondary capacitor coupled between the top of the first central secondary inductor and ground such that a first side of the secondary capacitor is coupled directly to the top of the first central secondary inductor and a second side of the secondary capacitor is coupled directly to ground; and
a first filtering capacitor coupled between the top of the first central secondary inductor and the bottom of the second central secondary inductor such that a first side of the first filtering capacitor is coupled directly to the top of the first central secondary inductor and a second side of the first filtering capacitor is coupled directly to the bottom of the second central secondary inductor.

7. The circuit of claim 6, further comprising:
a second filtering capacitor coupled between the top of the second central secondary inductor and ground.

8. The circuit of claim 6, further comprising:
a first primary inductor having a top coupled to a first balanced port and a bottom, and configured for magnetic communication with the first central secondary inductor, such that the top of the first primary inductor is in phase with the top of the first central secondary inductor;
a second primary inductor having a top coupled to the bottom of the first primary inductor and a bottom, and configured for magnetic communication with the second central secondary inductor;
a third primary inductor having a top coupled to the bottom of the second primary inductor and a bottom coupled to a second balanced port; and configured for magnetic communication with the first ground side secondary inductor; and a primary capacitor coupled between the top of the first primary inductor and the bottom of the third primary inductor.

9. A circuit for transforming and filtering, the circuit comprising:
an unbalanced side secondary inductor having a top coupled to an unbalanced port and a bottom;
a first central secondary inductor having a top coupled to the bottom of the unbalanced side secondary inductor and a bottom;
a second central secondary inductor having a top coupled to the bottom of the first central secondary inductor and a bottom;
a first ground side secondary inductor having a top coupled to the bottom of the second central secondary inductor and a bottom;
a second ground side secondary inductor having a top coupled to the bottom of the first ground side secondary inductor and a bottom;
a third ground side secondary inductor having a top coupled to the bottom of the second ground side secondary inductor and a bottom coupled directly to ground;
a secondary capacitor coupled between the top of the unbalanced side secondary inductor and ground; and
a first filtering capacitor coupled between the top of the first central secondary inductor and the bottom of the second central secondary inductor.

10. The circuit of claim 9, further comprising:
a second filtering capacitor coupled between the top of the second central secondary inductor and ground.

11. The circuit of claim 10, further comprising:
a first primary inductor having a top coupled to a first balanced port and a bottom, and configured for magnetic communication with the unbalanced side secondary inductor, such that the top of the first primary inductor is in phase with the top of the unbalanced side secondary inductor;
a second primary inductor having a top coupled to the bottom of the first primary inductor and a bottom, and configured for magnetic communication with the first central secondary inductor;
a third primary inductor having a top coupled to the bottom of the second primary inductor and a bottom, and configured for magnetic communication with the second central secondary inductor;
a fourth primary inductor having a top coupled to the bottom of the third primary inductor and a bottom, and configured for magnetic communication with the first ground side secondary inductor;
a fifth primary inductor having a top coupled to the bottom of the fourth primary inductor and a bottom, and configured for magnetic communication with the second ground side secondary inductor;
a sixth primary inductor having a top coupled to the bottom of the fifth primary inductor and a bottom coupled to a second balanced port, and configured for magnetic communication with the third ground side secondary inductor; and
a primary capacitor coupled between the top of the first primary inductor and the bottom of the sixth primary inductor.

* * * * *